(12) United States Patent
Kim et al.

(10) Patent No.: US 6,610,565 B2
(45) Date of Patent: Aug. 26, 2003

(54) METHOD OF FORMING A CMOS TYPE SEMICONDUCTOR DEVICE

(75) Inventors: Do-Hyung Kim, Seoul (KR); Jin-Ho Kim, Kyunggi-do (KR); Byung-Jun Hwang, Kunpo-shi (KR)

(73) Assignee: Samsung Electronics Co., Ltd. (KR)

( * ) Notice: Subject to any disclaimer, the term of this patent is extended or adjusted under 35 U.S.C. 154(b) by 67 days.

(21) Appl. No.: 10/017,237

(22) Filed: Dec. 14, 2001

(65) Prior Publication Data

US 2002/0164847 A1 Nov. 7, 2002

(30) Foreign Application Priority Data

May 4, 2001 (KR) ........................................ 2001-24331

(51) Int. Cl.$^7$ ............................................... H01L 21/00
(52) U.S. Cl. ..................... 438/233; 438/203; 438/199
(58) Field of Search ................................ 438/199, 203, 438/205, 217, 223, 227, 230, 231, 232, 233, 505, 506, 508, 307, 592, 305, 303

(56) References Cited

U.S. PATENT DOCUMENTS 4,722,909 A * 2/1988 Parrillo et al. .............. 438/231
4,818,714 A * 4/1989 Haskell ...................... 438/231
5,015,595 A * 5/1991 Wollesen .................... 438/231
5,045,916 A * 9/1991 Vor et al. ................... 257/383
5,229,307 A * 7/1993 Vora et al. .................. 438/234
5,930,634 A * 7/1999 Hause et al. ................ 438/307

* cited by examiner

Primary Examiner—Carl Whitehead, Jr.
Assistant Examiner—Laura M Schillinger
(74) Attorney, Agent, or Firm—Mills & Onello LLP (57) ABSTRACT

A method of forming a CMOS type semiconductor device comprises forming a gate electrode pattern on a surface of a substrate in NMOS and PMOS regions, forming spacers on side walls of the gate electrode pattern in the NMOS and PMOS regions, and doping n and p-type impurities heavily to the surface of the substrate in the NMOS and PMOS regions, respectively. After doping the p and n-type impurities heavily, the spacers are removed. The method further includes doping the n and p-type impurities lightly to the surface of the substrate in the NMOS and PMOS regions on which the spacers are removed. Alternatively, the light impurity implantation can be carried out before forming the spacers. Also, the light impurity implantation can be carried out to the surface of the substrate in one of the NMOS and PMOS regions before forming the spacers and to the surface of the substrate in the other of the NMOS and PMOS regions after removing the spacers.

8 Claims, 9 Drawing Sheets

Fig. 1

(Prior Art)

Fig. 2

(Prior Art)

Fig. 3

(Prior Art)

Fig. 4

(Prior Art)

Fig. 5

(Prior Art)

Fig. 6

(Prior Art)

METHOD OF FORMING A CMOS TYPE SEMICONDUCTOR DEVICE

RELATED APPLICATION

This application relies for priority upon Korean Patent Application No. 2001-24331, filed on May 4, 2001, the contents of which are herein incorporated by reference in their entirety.

FIELD OF THE INVENTION

The present invention relates to a method of forming a CMOS type semiconductor device, and more particularly to a method of forming a CMOS type semiconductor device using disposable spacers.

BACKGROUND OF THE INVENTION

A semiconductor device using MOS transistors generally has contacts for supplying voltage to source/drain regions of transistors. Also, as the elements incorporated in the device are increasingly integrated to a high degree, insulation spacers having an etch selectivity with respect to an interlayer insulation layer are formed on side walls of gate electrodes to prevent a short circuit between the gate electrodes and the contacts formed in the source/drain regions and to form a lightly doped drain (LDD) or dual doped structure easily in the source/drain regions.

However, as the integration degree of the semiconductor device continues to be increased, the sizes of source/drain regions themselves are decreased. Particularly, the area of the source/drain regions is narrowed by the spacers formed on the side walls of the gate electrodes. Also, when an etch stop layer is formed on the gate electrodes on which the spacers are formed, the area of source/drain regions is further narrowed. Therefore, when the source/drain regions between the gate electrodes are filled with an interlayer insulation layer, voids can be formed therein. Also, the contact area between contact plugs and the source/drain regions is reduced to increase the contact resistance. Further, if the spacers are misaligned, the portion of the source/drain regions in which the contacts are to be formed may be blocked and not exposed by the spacers during the etching for forming contact holes. Accordingly, in recent years, a MOS transistor structure which does not have spacers has been proposed and used.

Also, as the integration degree of the semiconductor device is increased, shallow conjunctions are formed in the source/drain regions. To prevent a hot carrier effect or a short channel effect due to the shallow conjunctions, it is required that the dual doped structure be formed in the source/drain regions. As a method for forming the dual doped structure without the spacers, a disposable oxide spacer scheme of removing spacers after forming the dual doped structure in the source/drain regions by using the spacers can be considered.

Figure 1:
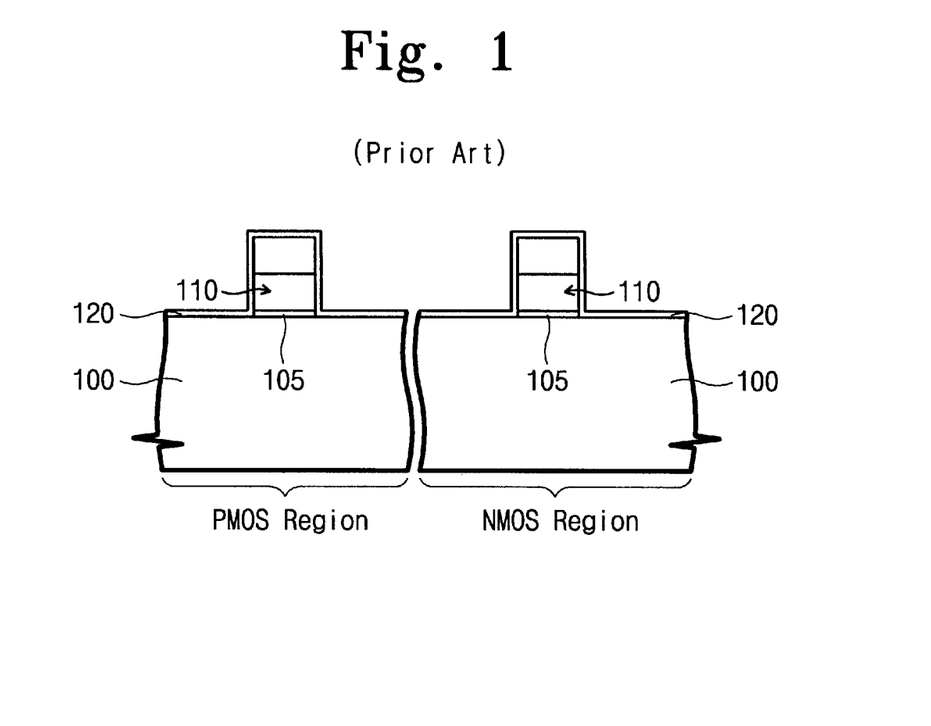
FIG. 1 to FIG. 6 are cross-sectional views illustrating the process steps of a conventional method of forming a CMOS type semiconductor device using disposable spacers.

FIG. 1 to FIG. 6 are cross-sectional views for illustrating the process steps of a conventional method of forming a CMOS type semiconductor device using disposable spacers. Referring to FIG. 1, gate electrodes 110 are formed through a patterning process on a surface of a substrate 100 in which an isolation layer and various wells are formed. An annealing process for curing etch damage is then carried out. Consequently, a thin oxide layer 120 is formed on the surfaces of the substrate 100 and the gate electrodes 110.

Figure 2:
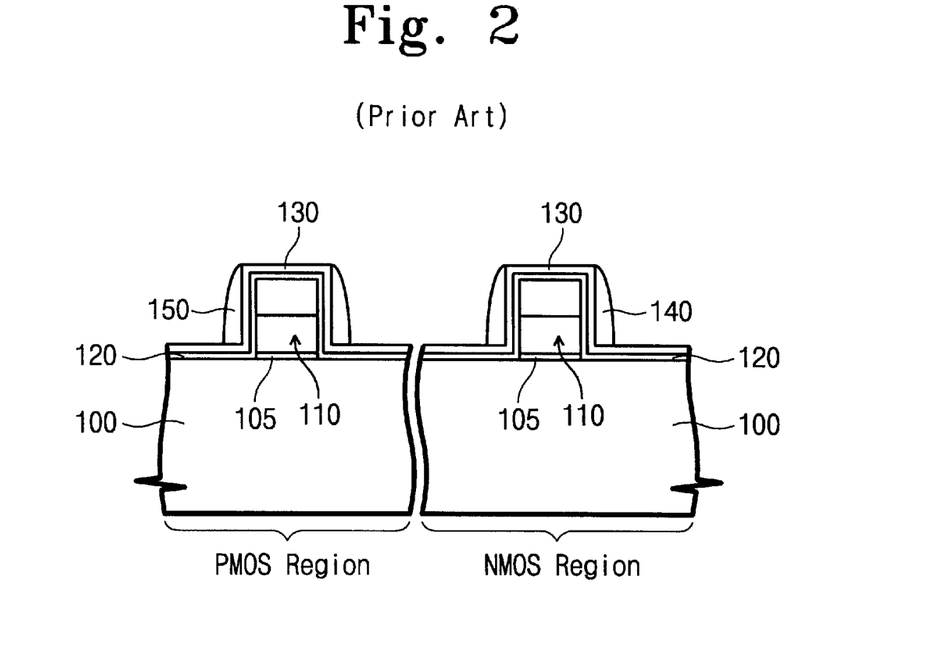

Referring to FIG. 2, a silicon nitride layer as an etch stop layer 130 is formed. To form spacers 140, 150, a silicon oxide layer is deposited over the whole surface of the substrate 100 on which the etch stop layer 130 is formed. The silicon oxide layer is anisotropically etched to form the spacers 140, 150 on side walls of the gate electrodes 110.

Figure 3:
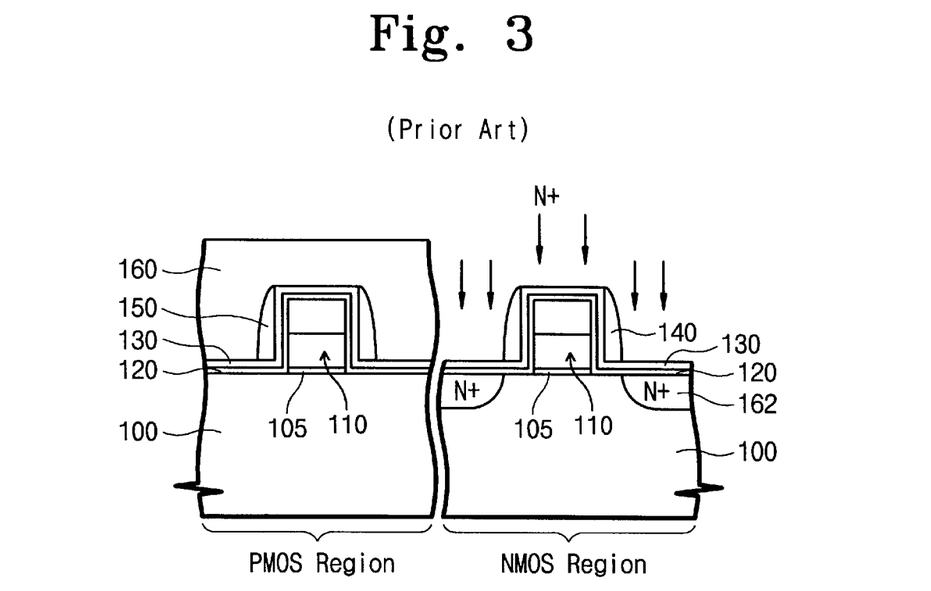

Referring to FIG. 3, a first photo-resist pattern 160 exposing a NMOS region is formed on the gate electrodes 110 on which the spacers 140, 150 are formed. The surface of the substrate 100 in the NMOS region is then heavily implanted by an n-type impurity.

Figure 4:
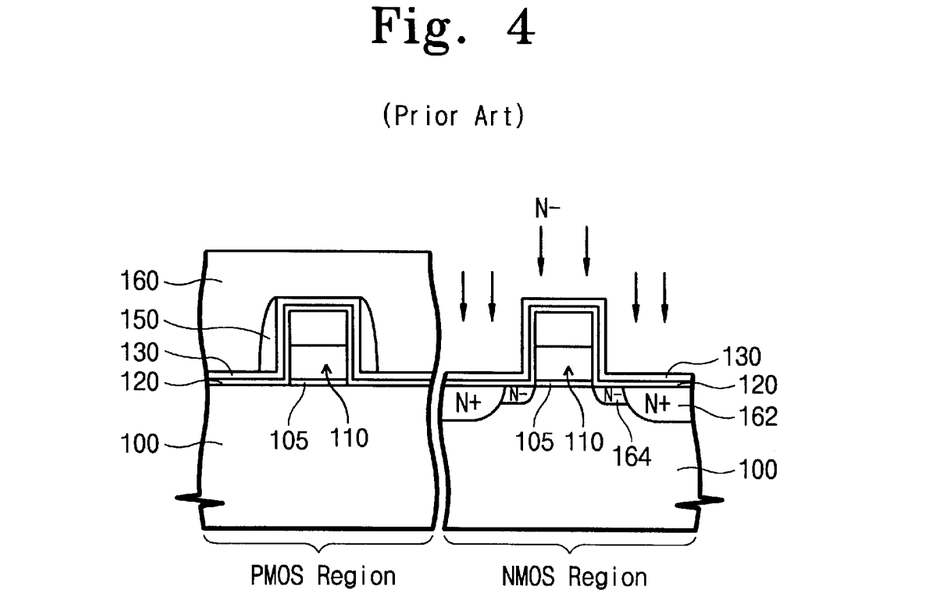

Referring to FIG. 3 and FIG. 4, the spacers 140 formed on the side walls of the gate electrodes 110 in the NMOS region are removed through a wet etching process which uses the photo-resist pattern 160 exposing the NMOS region as an etch mask. The surface of the substrate in source/drain regions of the NMOS region is then lightly implanted by the n-type impurity. Consequently, a NMOS transistor having a dual doped structure is formed. The dual doped structure has a lightly doped impurity region 164 formed in vicinity of the side walls of the gate electrodes 110 and a heavily doped impurity region 162 formed in the surface of the substrate which is spaced apart as much as a thickness of the spacers 140 from the side walls of the gate electrodes 110.

Figure 5:
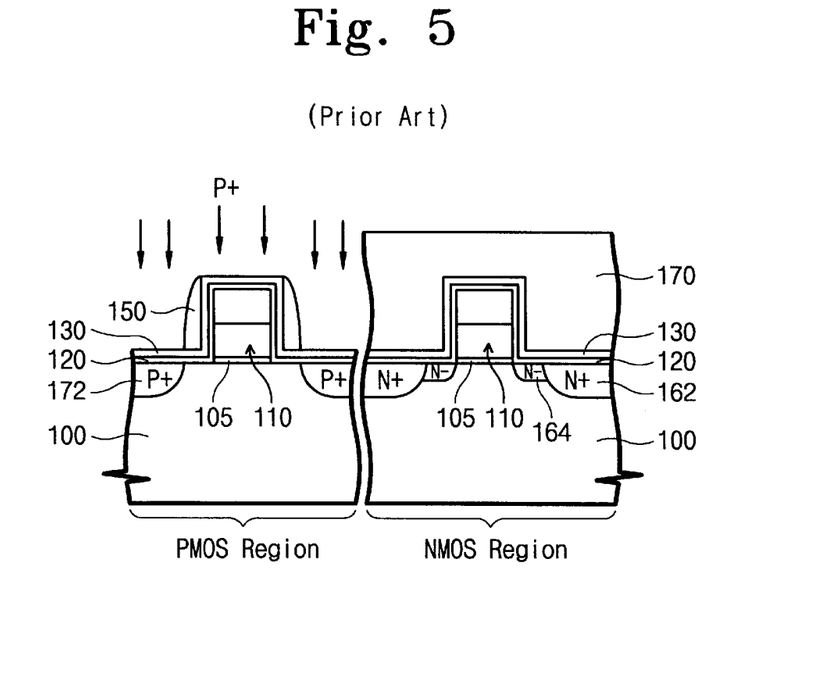

Referring to FIG. 4 and FIG. 5, the first photo-resist pattern 160 exposing the NMOS region is removed and a second photo-resist pattern 170 exposing the PMOS region is formed. The surface of the substrate 100 in the PMOS region is then heavily implanted by a p-type impurity. The second photo-resist pattern 170 and the gate electrodes 110 of the PMOS region on which the spacers 150 are formed acts as an impurity implantation mask.

Figure 6:
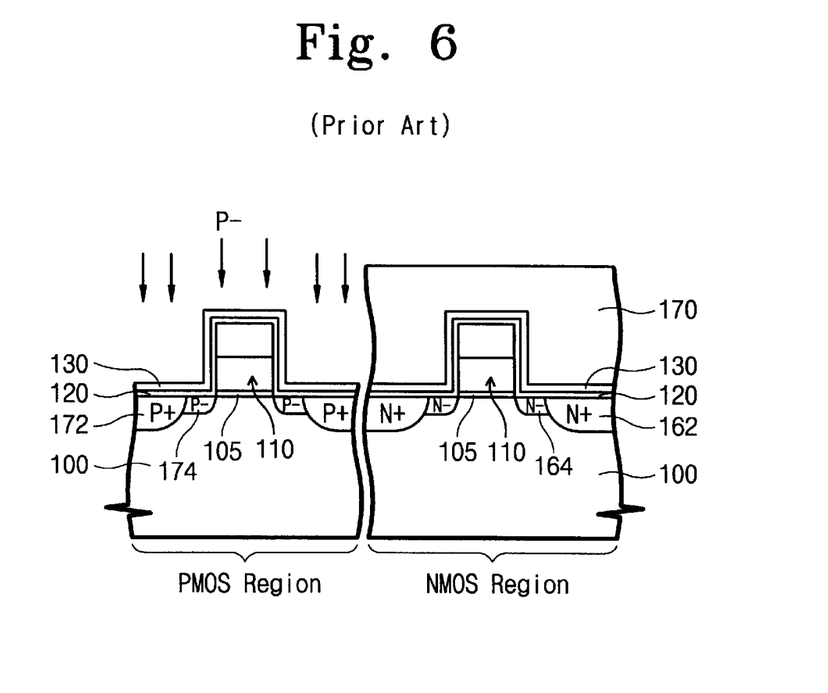

Referring to FIG. 5 and FIG. 6, the spacers 150 formed on the side walls of the gate electrodes 110 are removed through the wet etching process which uses the second photo-resist pattern 170 as an etch mask. The surface of the substrate 100 in source/drain regions of the PMOS region is then lightly implanted by the p-type impurity. Consequently, a PMOS transistor having a dual doped structure is formed. The dual doped structure has a lightly doped impurity region 174 formed in vicinity of the side walls of the gate electrodes 110 and a heavily doped impurity region 172 formed in the surface of the substrate 100 which is spaced apart as much as a thickness of the spacers 150 from the side walls of the gate electrodes 110. Thus, a CMOS transistor structure is obtained.

Next, a silicon oxide layer as an interlayer insulation layer is formed over the surface of the substrate on which the CMOS transistor structure is formed. The interlayer insulation layer is etched to form contact holes in source/drain regions. The etch stop layer enclosing the gate electrodes to protect it prevents a short circuit between the gate electrodes and contacts from being formed.

However, in the process described above, when the spacers formed on the side walls of the gate electrodes in the NMOS region are removed through the wet etching as shown in FIG. 4, the spacers formed on the side walls of the gate electrodes in the PMOS region on the border of the NMOS region are also partially removed. Accordingly, when the surface of the substrate in the PMOS region is heavily implanted by the p-type impurity, there is no means which can act as the impurity implantation mask on the spacer-removed portion of the gate electrodes in the PMOS region adjacent to the border of the NMOS region. Therefore, in the surface of the substrate 100 in vicinity of the spacer-removed portion of the gate electrodes, the dual doped structure is not formed, but the heavily doped impurity region is formed. Consequently, in the portion of the PMOS transistor without the dual doped structure, a drop in threshold voltage Vt and a change in saturated drain current Idsat due to the short channel effect occur, resulting in the effect that transistor characteristics are degraded.

SUMMARY OF THE INVENTION

Therefore, it is an object of the present invention to provide an improved method of forming a CMOS type semiconductor device using disposable spacers, which can precisely form a dual doped structure in interfaces between channel regions and source/drain regions in the CMOS type semiconductor device.

It is another object of the present invention to provide an improved method of forming a CMOS type semiconductor device which can restrain the hot carrier effect or the short channel effect to prevent degradation in transistor characteristics from occurring.

It is another object of the present invention to provide an improved method of forming a CMOS type semiconductor device which can precisely form a dual doped structure in source/drain regions while providing an area for contacts therein.

These and other objects are provided, according to the present invention, by a method of forming a CMOS type semiconductor device. In accordance with the invention, a gate electrode pattern is formed on a surface of a substrate in NMOS and PMOS regions. Spacers are formed on side walls of the gate electrode pattern in the NMOS and PMOS regions, and a photo-resist pattern is formed exposing one of said NMOS and PMOS regions. A first conductive impurity is heavily doped using the first photo-resist pattern as an impurity implantation mask. The first photo-resist pattern is then removed. A second photo-resist pattern is formed exposing the other of said NMOS and PMOS regions, and said other of said NMOS and PMOS regions is heavily doped with a second conductive impurity. The spacers formed on the side walls of the gate electrode pattern in the other of said NMOS and PMOS regions are then removed using the second photo-resist pattern as an etch mask. The other of said NMOS and PMOS regions is lightly doped with the second conductive impurity, and the second photo-resist patter is removed. The spacers formed on the side walls of the gate electrode pattern in the one of the NMOS and PMOS regions is removed.

In one embodiment, the method includes forming a third photo-resist pattern exposing said one of said NMOS and PMOS regions, and lightly doping the first conductive impurity to the one of the NMOS and PMOS regions, between the step of forming a gate electrode pattern and the step of forming spacers.

In another embodiment, the method includes the steps of forming a third photo-resist pattern exposing the one of said NMOS and PMOS regions, and lightly doping the first conductive impurity to said one of said NMOS and PMOS regions after the step of removing the spacers formed on the side walls of the gate electrode pattern in the one of said NMOS and PMOS regions.

In another embodiment, the method includes the step of forming an etch stop layer having an etch selectivity with respect to the spacers on the gate electrode pattern before the step of forming spacers.

In another embodiment, the method includes the steps of forming an interlayer insulation layer on the gate electrode pattern, and forming contact holes exposing at least a portion of source/drain regions between gate electrodes forming the gate electrode pattern. The method can further include the step of forming an etch stop layer for contact holes having an etch selectivity with respect to the interlayer insulation layer before the step of forming the interlayer insulation layer. The method can also include the step of forming wires and contacts by forming a barrier metal layer and a metal layer over the surface of the substrate in which the contact holes are formed and patterning the barrier metal layer and the metal layer.

In another embodiment, the step of removing spacers includes removing the spacers using wet etching.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Embodiment 1

FIG. 7 to FIG. 12 are cross-sectional views for illustrating the process steps of a method of forming a CMOS type semiconductor device in accordance with a first embodiment of the present invention.

Figure 7:
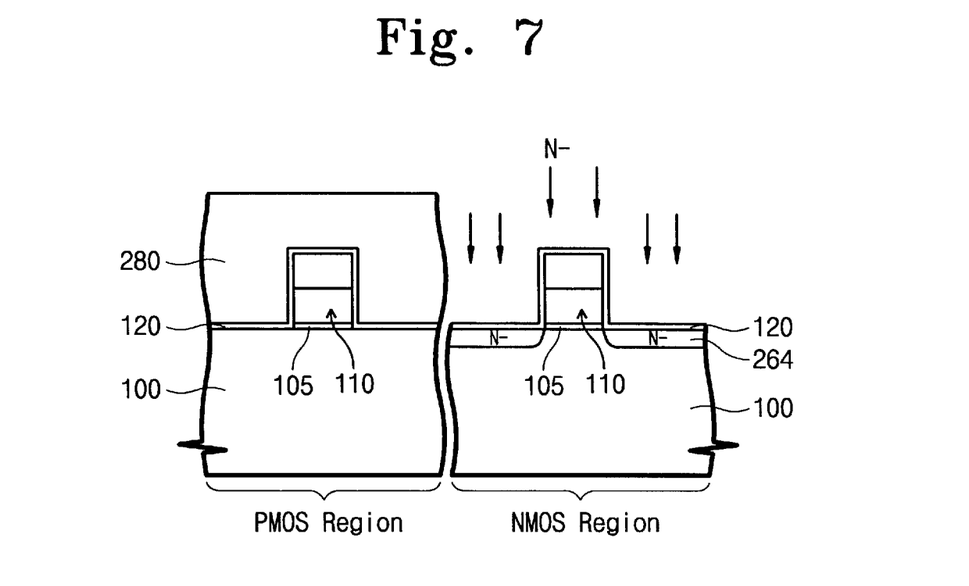
FIG. 7 to FIG. 12 are cross-sectional views illustrating the process steps of a method of forming a CMOS type semiconductor device in accordance with an embodiment of the present invention.

Referring to FIG. 7, a gate insulation layer and gate layers are sequentially formed on a surface of a substrate 100 in NMOS and PMOS regions on which various impurity wells and an isolation layer are formed. The gate layers and the gate insulation layer are then patterned to form a gate electrode pattern 105, 110 comprising a plurality of gate electrodes 110. A heat treatment for curing etch damage is then carried out. On the surfaces of the substrate 100 and the gate electrodes 110, a thin oxide layer 120 is formed. Thereafter, a first photo-resist pattern 280 which exposes the NMOS region is formed. The surface of the substrate 100 in source/drain regions of the exposed NMOS region is lightly implanted by an n-type impurity. In the impurity implantation, the impurity implantation energy is 20 KeV. Also, the first photo-resist pattern 280 and the gate electrodes 110 function as an impurity implantation mask.

Figure 8:
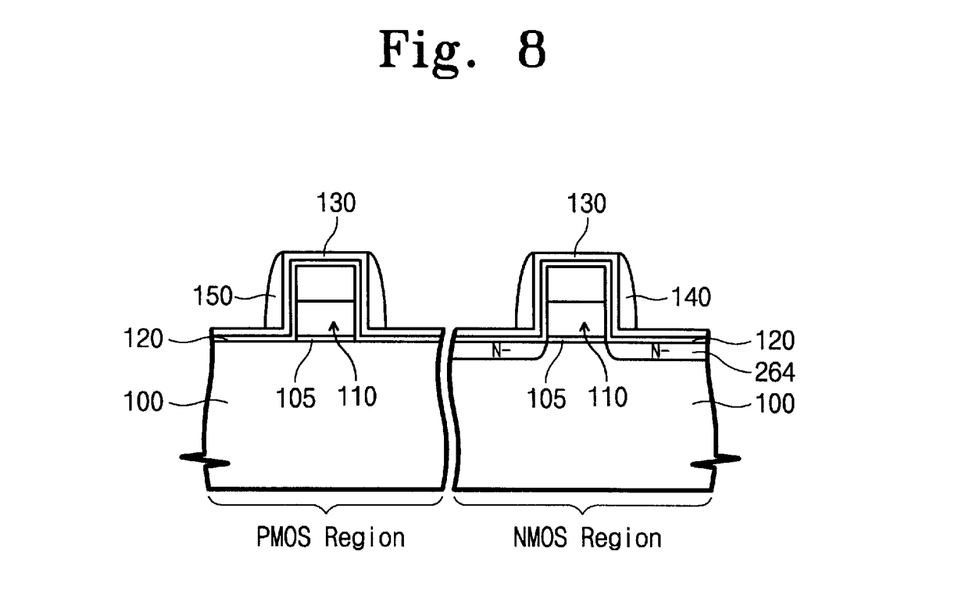

Referring to FIG. 8, the first photo-resist pattern 280 is removed. On the gate electrodes 110 in the NMOS and PMOS regions, a silicon nitride layer as an etch stop layer 130 is then formed at a thickness of several ten to several hundred angstroms (Å) by a chemical vapor deposition (CVD) method. A silicon oxide layer is then deposited at a thickness of 100 to 1,000 Å over the whole surface of the substrate 100. The silicon oxide layer is anisotropically etched to form spacers 140, 150 on side walls of the gate electrodes 110.

Figure 9:
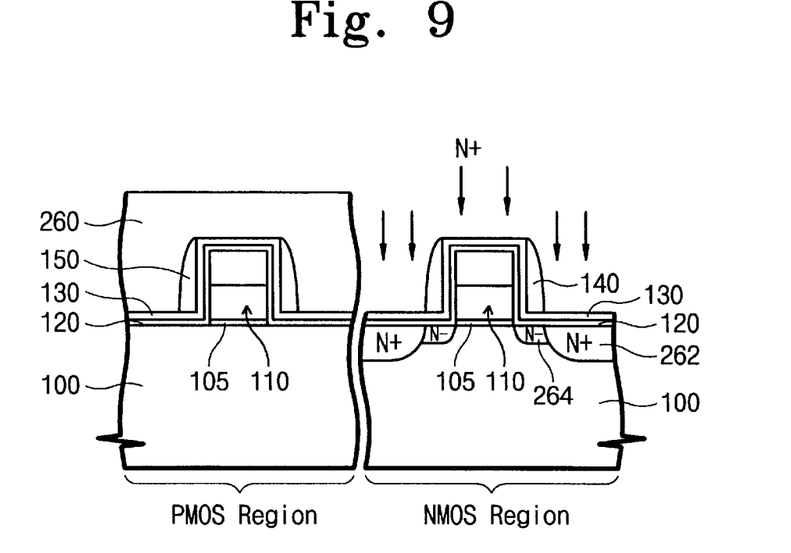

Referring to FIG. 9, a second photo-resist pattern 260 exposing the NMOS region is formed. The surface of the substrate 100 in the NMOS region is then heavily implanted by an n-type impurity such as a phosphorus (P). In one particular embodiment, the impurity implantation energy is 90 KeV. Also, the second photo-resist pattern 260 and the gate electrodes 110 in the NMOS region on which the spacers 140 are formed function as an impurity implantation mask. Consequently, in the source/drain regions of the NMOS region, n-type impurity-doped regions 262, 264 having dual doped structures are formed. The etch stop layer 130 formed on the surface of the substrate 100 functions as a buffer during the impurity implantation.

Figure 10:
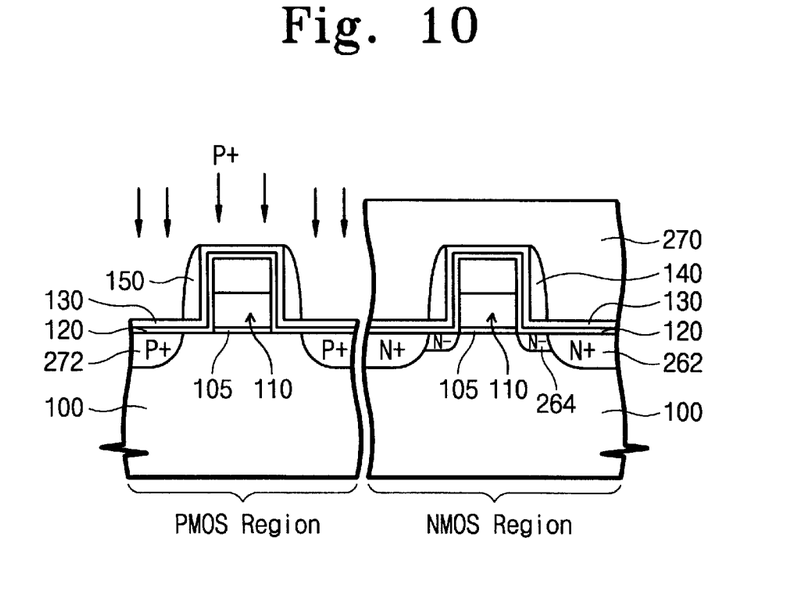

Referring to FIG. 10, the second photo-resist pattern 260 is removed through an ashing or stripping process. A third photo-resist pattern 270 exposing the PMOS region is then formed. The surface of the substrate 100 in the PMOS region is heavily implanted by an p-type impurity such as a boron (B). In one embodiment, the impurity implantation energy is 60 KeV. Also, the third photo-resist pattern 270 and the gate electrodes 110 in the PMOS region on which the spacer 150 are formed function as an impurity implantation mask. The etch stop layer 130 formed on the surface of the substrate 100 functions as a buffer during the impurity implantation.

Figure 11:
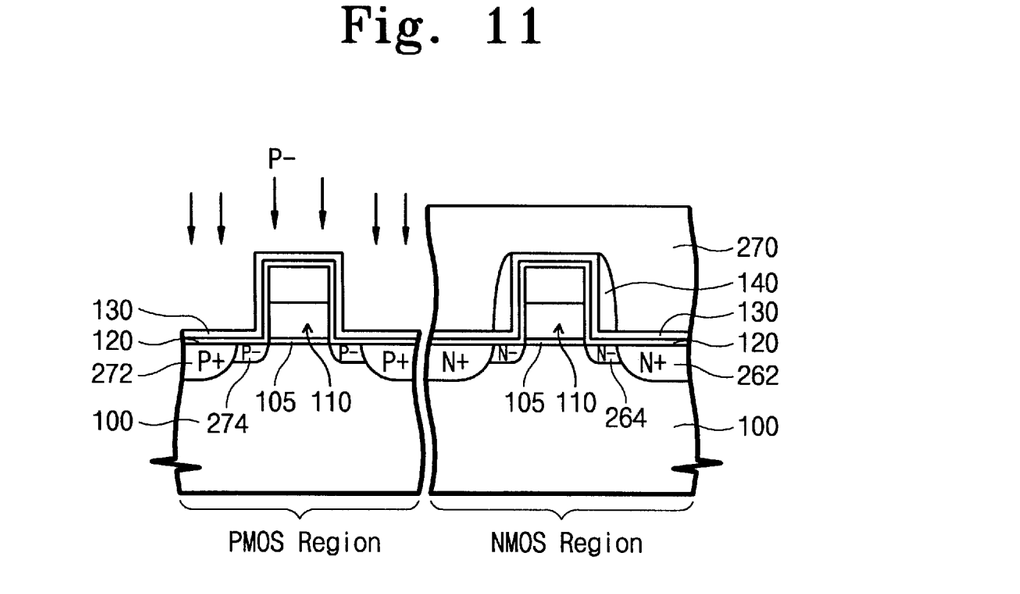

Referring to FIG. 11, the spacers 150 formed on the side walls of the gate electrodes 110 are removed using a wet etchant such as a thin hydrofluoric acid. The surface of the substrate 100 in source/drain regions of the PMOS region is then lightly implanted with boron. In one embodiment, the impurity energy is 15 KeV. Also, the third photo-resist pattern 270 and the gate electrodes 110 function as an impurity implantation mask. Consequently, p-type impurity-doped regions 272, 274 having dual doped structures are formed in the source/drain regions of the PMOS region. When the spacer 150 is removed, spacers 140 formed on the side walls of the gate electrodes 110 on the border of the NMOS region can be partially removed. However, at this time, since all the impurity implantations are already finished in the NMOS region, there is no change in the dual doped structure formed in the source/drain regions of the NMOS region. Accordingly, degradation in transistor characteristic does not occur due to the hot carrier effect and the like.

Figure 12:
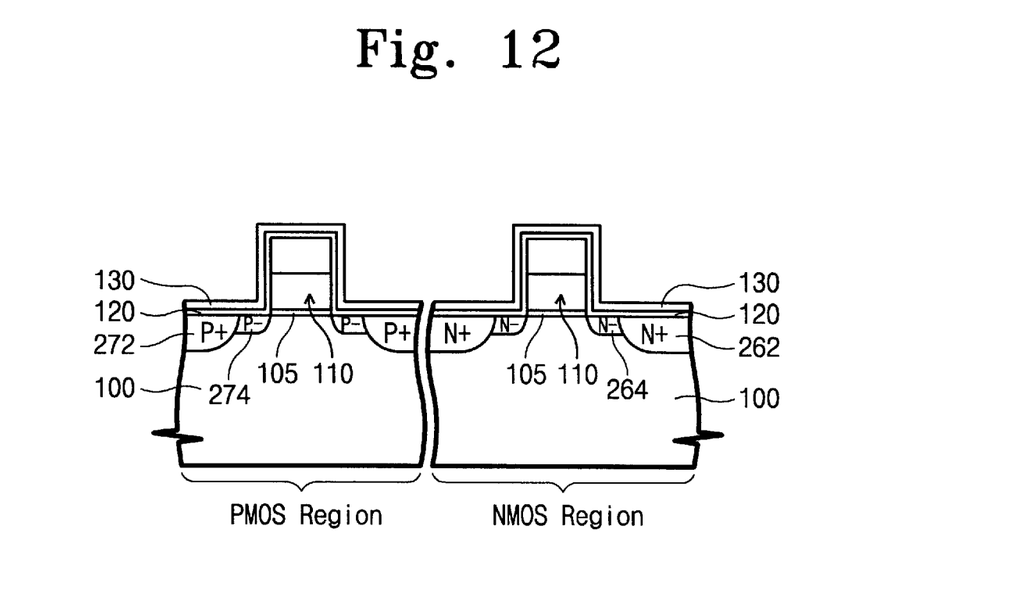

Referring to FIG. 12, the third photo-resist pattern 270 is removed. The spacers 140 remaining on the side walls of the gate electrodes 110 in the NMOS region are then removed.

During subsequent process steps, for example, an etch stop layer for contact holes and an interlayer insulation layer are sequentially formed on the gate electrode pattern which is covered with the etch stop layer 130. The etch stop layer for contact holes is formed of a silicon nitride layer having a thickness of several ten and several hundred Å and the interlayer insulation layer is formed of a silicon oxide layer having a thickness of several thousand to 10,000 Å. A planarization etching process is then carried out to the etch stop layer for contact holes and the interlayer insulation layer. To form contact holes in the source/drain regions, the interlayer insulation layer is patterned. The contact holes are filled with a conductive layer and the planarization etching process is carried out to it. Consequently, contact plugs are formed in the source/drain regions.

Embodiment 2

Figure 13:
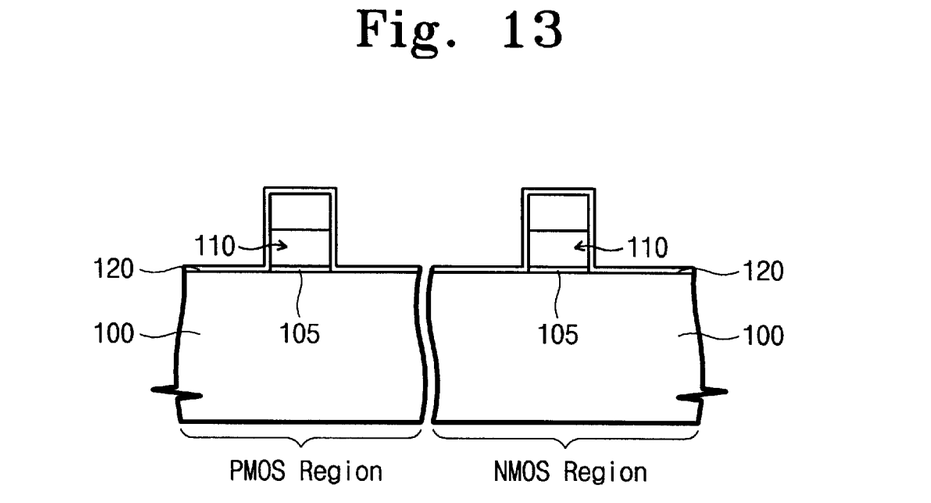
FIG. 13 to FIG. 18 are cross-sectional views illustrating the process steps of a method of forming a CMOS type semiconductor device in accordance with another embodiment of the present invention.

FIG. 13 to FIG. 18 are cross-sectional views illustrating the process steps of a method of forming a CMOS type semiconductor device in accordance with a second embodiment of the present invention. Referring to FIG. 13, a gate insulation layer and gate layers are sequentially formed on a surface of a substrate 100 in NMOS and PMOS regions on which various impurity wells and an isolation layer are formed. The gate layers and the gate insulation layer are then patterned to form a gate electrode pattern 105, 110 comprising a plurality of gate electrodes 110. On the surfaces of the substrate and the gate electrodes 110, a thin oxide layer 120 is formed.

Figure 14:
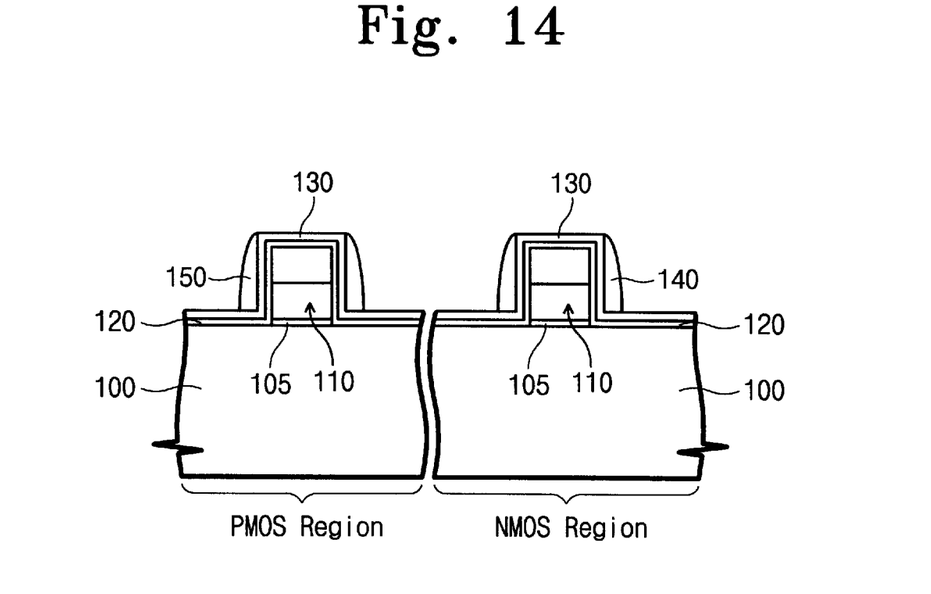

Referring to FIG. 14, on the gate electrodes 110 in the NMOS and PMOS regions, a silicon nitride layer as an etch stop layer 130 is formed at a thickness of several ten to several hundred Å by a CVD method. A silicon oxide layer is then deposited at a thickness of 100 to 1,000 Å over the whole surface of the substrate 100. Then, the silicon oxide layer is anisotropically etched to form spacers 140, 150 on side walls of the gate electrodes 110.

Figure 15:
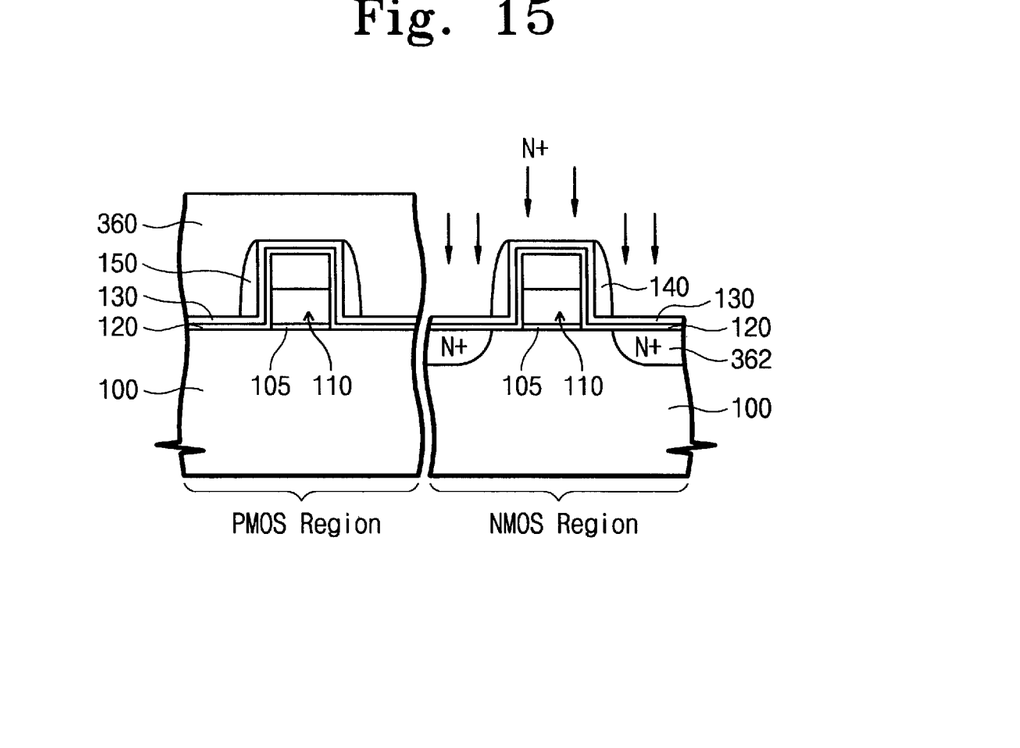

Referring to FIG. 15, a first photo-resist pattern 360 exposing the NMOS region is formed. The surface of a substrate 100 in the NMOS region is then heavily implanted by an p-type impurity. At this time, the first photo-resist pattern 360 and the gate electrodes 110 in the NMOS region on which the spacers 140 are formed function as an impurity implantation mask. Consequently, in source/drain regions, an n-type impurity-doped region 362 is formed. The etch stop layer 130 formed over a surface of the substrate 100 functions as a buffer during the impurity implantation.

Figure 16:
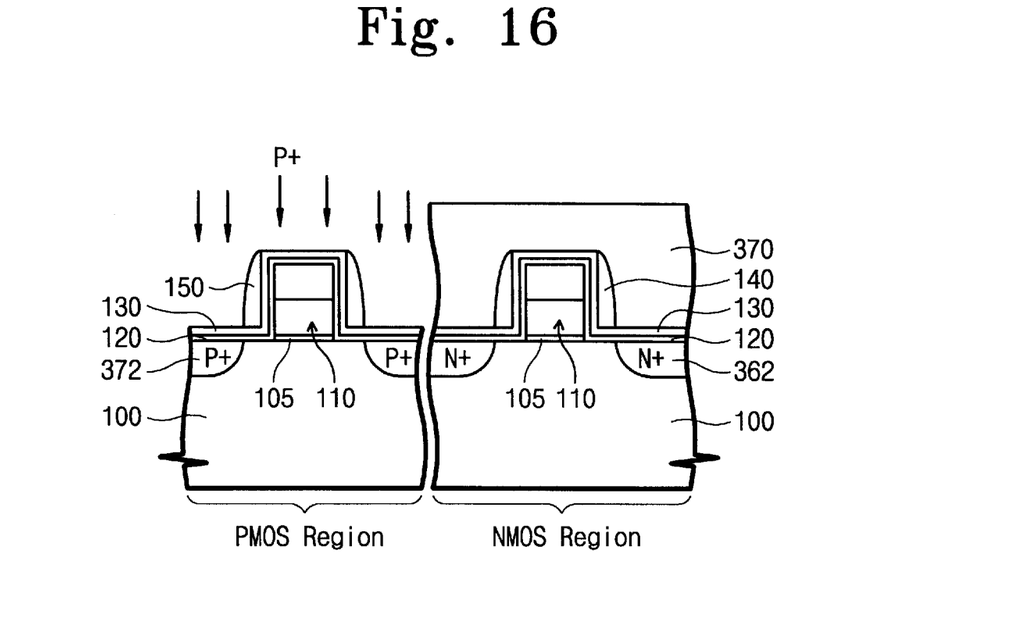

Referring to FIG. 16, the first photo-resist pattern 360 is removed through an ashing or stripping process. A second photo-resist pattern 370 exposing the PMOS region is then formed. The surface of the substrate 100 in the PMOS region is heavily implanted by an p-type impurity. In one embodiment, the second photo-resist pattern 370 and the gate electrodes 110 in the PMOS region in which the spacers 150 are formed function as an impurity implantation mask. Also, the etch stop layer 130 formed on the surface of the substrate 100 functions as a buffer during the impurity implantation.

Figure 17:
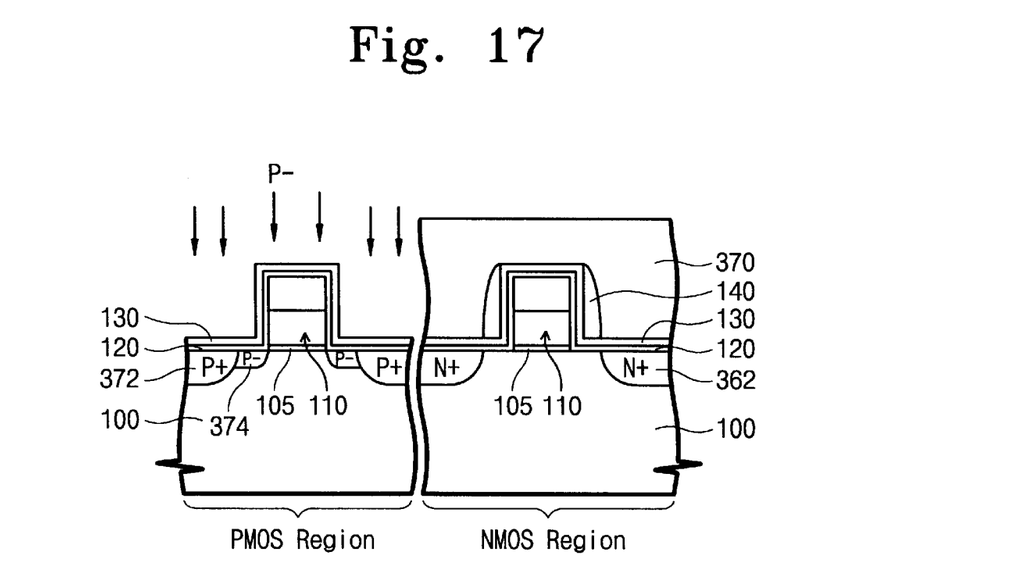

Referring to FIG. 17, the spacers 150 formed on the side walls of the gate electrodes 110 are removed using a wet etchant such as a thin hydrofluoric acid or the like. The surface of the substrate 100 in the source/drain regions of the PMOS region is then lightly implanted by the p-type impurity. At this time, the second photo-resist pattern 370 and the gate electrodes 110 function as an impurity implantation mask. Consequently, p-type impurity-doped regions 372, 374 having dual doped structures are formed in the source/drain regions of the PMOS region. When the spacers 150 are removed, the spacers 140 formed on the side walls of the gate electrodes 110 on the border of the NMOS region can be removed. At this time, since the heavy impurity implantation is already finished in the NMOS region, there is no problem in forming a dual doped structure in the source/drain regions in the NMOS region through a light impurity implantation later. Accordingly, a degradation in transistor characteristic do not occur due to the hot carrier effect and the like.

Figure 18:
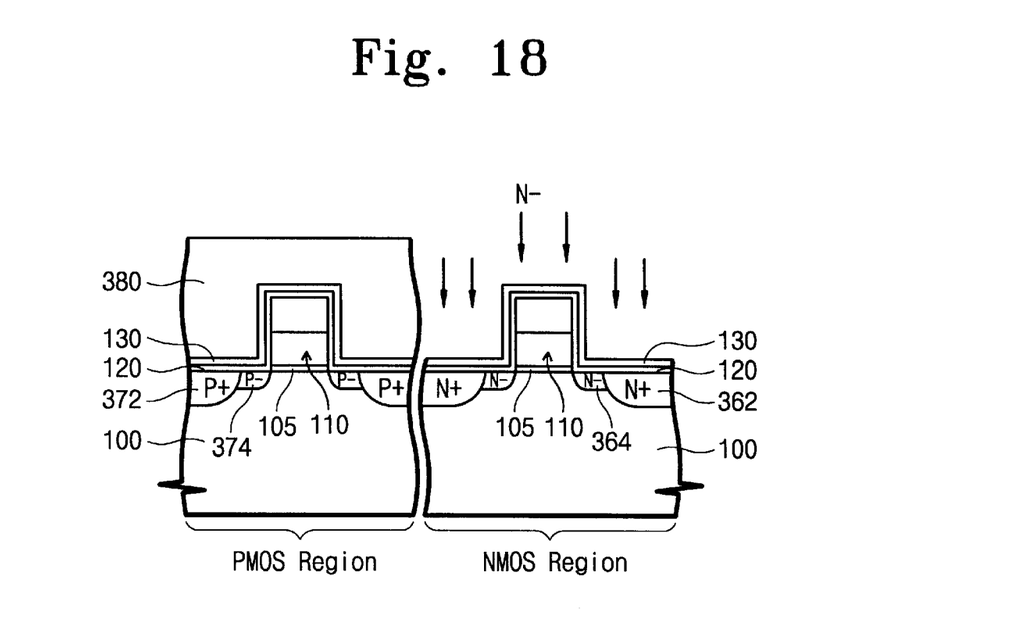

Referring to FIG. 18, the second photo-resist pattern 370 is removed. A third photo-resist pattern 380 exposing the NMOS region is then formed. The spacers 140 remaining on the side walls of the gate electrodes 110 in the NMOS region are then removed. Thereafter, the surface of the substrate 100 in the source/drain region of the NMOS region is lightly implanted by the n-type impurity. The third photo-resist pattern 380 and the gate electrodes 110 function as an impurity implantation mask. Consequently, n-type impurity-doped regions 362, 364 having dual doped structures are formed in the source/drain regions of the NMOS region.

The third photo-resist pattern 380 is removed and an interlayer insulation layer is formed on the gate electrode pattern which is covered with the etch stop layer 130. The interlayer insulation layer is formed of a silicon oxide layer having a thickness of several thousand to 10,000 Å. A planarization etching process is then carried out to the interlayer insulation layer. To form contact holes in the source/drain regions, the interlayer insulation layer is patterned. On the contact holes and the interlayer insulation layer, a barrier metal layer and a conductive layer are sequentially formed and patterned to form contacts and lines.

As apparent from the foregoing description, it can be appreciated that the present invention can precisely form the dual doped structure in the source/drain regions when the CMOS type semiconductor device is formed using the disposable spacers, thereby preventing the degradation in transistor characteristics from occurring due to the hot carrier effect or the short channel effect.

In the drawings and specification, there have been disclosed typical preferred embodiments of the invention and, although specific terms are employed, they are used in a generic and descriptive sense only and not for purpose of limitation, the scope of the invention being set forth in the following claims.

What is claimed is:

1. A method of forming a CMOS type semiconductor device comprising the steps of:

forming a gate electrode pattern on a surface of a substrate in NMOS and PMOS regions;

forming spacers on side walls of said gate electrode pattern in said NMOS and PMOS regions;

forming a first photo-resist pattern exposing one of said NMOS and PMOS regions;

heavily doping a first conductive impurity using said first photo-resist pattern as an impurity implantation mask;

removing said first photo-resist pattern;

forming a second photo-resist pattern exposing the other of said NMOS and PMOS regions;

heavily doping a second conductive impurity to the other of said NMOS and PMOS regions;

removing said spacers formed on said side walls of said gate electrode pattern in the other of said NMOS and PMOS regions using said second photo-resist pattern as an etch mask;

lightly doping said second conductive impurity to the other of said NMOS and PMOS regions;

removing said second photo-resist pattern; and removing said spacers formed on said side walls of said gate electrode pattern in said one of said NMOS and PMOS regions.

2. The method according to claim 1, further including the steps of forming a third photo-resist pattern exposing said one of said NMOS and PMOS regions, and lightly doping said first conductive impurity to said one of said NMOS and PMOS regions, between said step of forming a gate electrode pattern and said step of forming spacers.

3. The method according to claim 1, further including the steps of forming a third photo-resist pattern exposing said one of said NMOS and PMOS regions, and lightly doping said first conductive impurity to said one of said NMOS and PMOS regions after said step of removing said spacers formed on said side walls of said gate electrode pattern in said one of said NMOS and PMOS regions.

4. The method according to claim 1, further including the step of forming an etch stop layer having an etch selectivity with respect to said spacers on said gate electrode pattern before said step of forming spacers.

5. The method according to claim 1, further including the steps of forming an interlayer insulation layer on said gate electrode pattern, and forming contact holes exposing at least a portion of source/drain regions between gate electrodes forming said gate electrode pattern.

6. The method according to claim 5, further including the step of forming an etch stop layer for contact holes having an etch selectivity with respect to said interlayer insulation layer before said step of forming said interlayer insulation layer.

7. The method according to claim 5, further including the step of forming wires and contacts by forming a barrier metal layer and a metal layer over said surface of said substrate in which said contact holes are formed and patterning the barrier metal layer and the metal layer.

8. The method according to claim 1, wherein said step of removing spacers comprises removing said spacers through wet etching.

* * * * *